(12) United States Patent
Mizutani et al.

(10) Patent No.: US 11,533,991 B2
(45) Date of Patent: Dec. 27, 2022

(54) STORAGE APPARATUS

(71) Applicant: Murata Machinery, Ltd., Kyoto (JP)

(72) Inventors: Minoru Mizutani, Inuyama (JP);
Masafumi Hayakawa, Inuyama (JP);
Hiroyasu Tomita, Inuyama (JP);
Masataka Hayashi, Inuyama (JP)

(73) Assignee: Murata Machinery, Ltd., Kyoto (JP)

( * ) Notice: Subject to any disclaimer, the term of this patent is extended or adjusted under 35 U.S.C. 154(b) by 336 days.

(21) Appl. No.: 16/766,769

(22) PCT Filed: Oct. 29, 2018

(86) PCT No.: PCT/JP2018/040063
§ 371 (c)(1),
(2) Date: May 26, 2020

(87) PCT Pub. No.: WO2019/102795
PCT Pub. Date: May 31, 2019

(65) Prior Publication Data
US 2021/0076817 A1    Mar. 18, 2021

(30) Foreign Application Priority Data
Nov. 27, 2017 (JP) .............................. JP2017-226460

(51) Int. Cl.
*A47B 49/00* (2006.01)
*H02J 50/10* (2016.01)
(Continued)

(52) U.S. Cl.
CPC .......... *A47B 49/008* (2013.01); *A47B 49/004* (2013.01); *B65G 1/04* (2013.01); *H02J 50/10* (2016.02); *H02J 50/70* (2016.02)

(58) Field of Classification Search
CPC ......... H01L 21/67769; H01L 21/67359; H01L 21/67383; H01L 21/67386; B65G 1/04;
(Continued)

(56) References Cited

U.S. PATENT DOCUMENTS

| 4,867,629 A | 9/1989 | Iwasawa et al. |
| 5,226,713 A | 7/1993 | Matsumura |

(Continued)

FOREIGN PATENT DOCUMENTS

| CN | 106711072 A | 5/2017 |
| JP | H11-43223 A | 2/1999 |

(Continued)

OTHER PUBLICATIONS

Notification of Reason for Refusal dated Sep. 29, 2021, of counterpart Korean Application No. 10-2020-7009491, along with an English translation.

(Continued)

*Primary Examiner* — Patrick D Hawn
(74) *Attorney, Agent, or Firm* — DLA Piper LLP (US)

(57) ABSTRACT

A storage apparatus that stores objects includes a housing; a fixed part disposed in the housing and fixed in a position against the housing; a rotating part connected to the fixed part through a rotating shaft extending in the vertical direction and rotates relative to the fixed part as a center of the rotating shaft; and a rotating shaft driving part that rotates the rotating shaft; wherein the fixed part includes a power-transmission unit that transmits electric power in noncontact state; and the rotating part includes a rotating shelf on which objects are disposed; a power drive device disposed to rotate integrally with the rotating shelf and driven by electric power; and a power-receiving unit that supplies the electric power transmitted from the power-transmission unit to the power drive device.

10 Claims, 12 Drawing Sheets

(51) Int. Cl.
*H02J 50/70* (2016.01)
*B65G 1/04* (2006.01)

(58) Field of Classification Search
CPC ......... H02J 50/10; H02J 50/70; A47B 49/008; A47B 49/004
See application file for complete search history.

(56) References Cited

U.S. PATENT DOCUMENTS

| | | | |
|---|---|---|---|
| 5,583,408 A | 12/1996 | Lowrance | |
| 6,582,174 B1* | 6/2003 | Hayashi | H01L 21/67769 414/217 |
| 7,197,113 B1 | 3/2007 | Katcha et al. | |
| 7,544,329 B2* | 6/2009 | Malin | G01N 35/04 422/430 |
| 8,759,084 B2* | 6/2014 | Nichols | A61L 2/07 422/1 |
| 9,230,838 B2* | 1/2016 | Jäger | H01L 21/6734 |
| 9,466,994 B2 | 10/2016 | Yamazaki et al. | |
| 2004/0037675 A1* | 2/2004 | Zinger | H01L 21/67757 414/217 |
| 2008/0023417 A1 | 1/2008 | Yamamoto | |
| 2010/0292826 A1 | 11/2010 | Blattner et al. | |
| 2010/0294397 A1 | 11/2010 | Kishkovich et al. | |
| 2012/0027547 A1 | 2/2012 | Jäger et al. | |
| 2014/0119856 A1 | 5/2014 | Duhamel et al. | |
| 2014/0124331 A1 | 5/2014 | Fukushima | |

FOREIGN PATENT DOCUMENTS

| | | |
|---|---|---|
| JP | 2002-171698 A | 6/2002 |
| JP | 2007-165876 A | 6/2007 |
| JP | 2009-545141 A | 12/2009 |
| JP | 2011-169043 A | 9/2011 |
| JP | 2013-110805 A | 6/2013 |
| KR | 10-2013-0080817 A | 7/2013 |
| WO | 2013/001930 A1 | 1/2013 |

OTHER PUBLICATIONS

Extended European Search Report dated Jul. 8, 2021, of counterpart European Application No. 18881765.4.

\* cited by examiner

STORAGE APPARATUS

TECHNICAL FIELD

This disclosure relates mainly to a storage apparatus with a rotating shelf.

BACKGROUND

A storage apparatus for storing a reticle and the like used for semiconductor integrated circuit manufacturing is known. Japanese Unexamined Patent Application Publication No. 2009-545141 discloses such a type of a storage apparatus.

The storage apparatus in JP '141 includes a housing that forms at least one closed area for storing an object such as wafers or reticles. An object storage apparatus is disposed in the housing. The object storage apparatus having a plurality of annular shelves disposed in parallel in the vertical direction. The object storage apparatus includes means for realizing a rotary motion around a vertical rotation axis. The object storage apparatus comprises of a plurality of storage modules. The object storage apparatus is rotated by an electric driving device such that the storage module disposed in the object storage apparatus enters an arrival position of an object handling device. An object stored in the storage module is operated by the object handling device.

Placing the devices such as various sensors and cameras inside the object storage apparatus has been demanded of the quality management of the object such as a reticle. With the configuration in JP '141, however, when electric power is to be supplied to the sensors from electric power source provided outside the object storage apparatus, twisting of electric power supply cable occurs because the object storage apparatus rotates.

It could therefore be helpful to provide a storage apparatus that electric power can be supplied to a device disposed on a rotating shelf, while maintaining rotation of the rotating shelf.

SUMMARY

We thus provide:

A storage apparatus includes a housing, a fixed part, a rotating part and a rotating shaft driving part. The fixed part is disposed in the housing and is fixed its position against the housing. The rotating part is connected to the fixed part through a rotating shaft extending in the vertical direction and rotates relative to the fixed part as a center of the rotating shaft. The rotating shaft driving part rotates the rotating shaft. The fixed part includes a power-transmission unit that transmits electric power in non-contact state. The rotating part includes a rotating shelf, a power drive device and a power-receiving unit. The object is disposed on the rotating shelf. The power drive device is disposed to rotate integrally with the rotating shelf and is driven by electric power. The power-receiving unit supplies the power transmitted from the power-transmission unit to the power drive device.

This enables wireless power feeding to the power drive device that rotates with the rotating part as required.

It is preferable that the storage apparatus includes the power-transmission unit including a support and a conductor. The support surrounds at least a part of the outer circumferential of the rotating shaft. The conductor is disposed on the support along the direction in which the support extends. The power-receiving unit includes a coil formed by winding a conductive component. When a magnetic field generated by flowing a current through the conductor of the power-transmission unit causes, an induced current is generated in the coil of the power-receiving unit. In this way, it is possible to realize a wireless power supply with a simple configuration.

The conductor may be formed by a circuit pattern of a printed board. This makes it possible to provide a low-cost and compact power-transmission unit.

It is possible to include the support having a conductor guiding part formed to extend in the circumferential direction. The conductor is disposed along the conductor guiding part. The power-transmission unit can be formed with a simple configuration.

It is preferable that the power-transmission unit includes a magnetic sheet provided on a side opposite to a side where the conductor and the power-receiving unit face each other. This enables the magnetic sheet to serve as a back yoke, which allows a magnetic flux that a charged conductor occurs can be concentrated on the power-receiving unit side. This result enables the power-transmission efficiency of the power-transmission unit to be improved with a compact configuration.

It is preferable that another component is disposed or a gap is formed between the conductor and the magnetic sheet. This allows the distance between the conductor and the magnetic sheet to be simply separated and it is possible to prevent the magnetic flux that a conductive material occurs from flowing to the side opposite to the power-receiving unit.

It is preferable that a plate member made of a non-magnetic material is disposed between the conductor and the magnetic sheet. Thus, with a compact configuration, it is possible to effectively reduce the magnetic flux that a conductive material occurs from flowing to the side opposite to the power-receiving unit.

It is preferable that the storage apparatus includes at least two power-receiving units disposed on the circumference around the rotating shaft. The power-transmission unit is disposed to face a rotation track of the power-receiving unit. When viewed in a direction parallel to the rotating shaft, the power-transmission unit is formed in a circle arc shape having an opening which along a circumferential direction of the rotating shaft and is disposed always overlap at least one of the power-receiving unit. In this way, it is possible to realize miniaturization of a power-transmission unit and a stable wireless power supply.

It is preferable that the storage apparatus includes the opening being formed in the size that make it possible to pass the rotating shaft. The power-transmission unit is detachably mounted to an outer circumferential side of the rotating shaft. This enables installation/removal of the power-transmission unit and the maintenance workability can be improved.

It is preferable that the power drive device includes at least one of temperature sensor, humidity sensor, gas component detector and camera. Information related to the storage condition in the rotating shelf using the power drive device can therefore be readily obtained.

Figure 1:
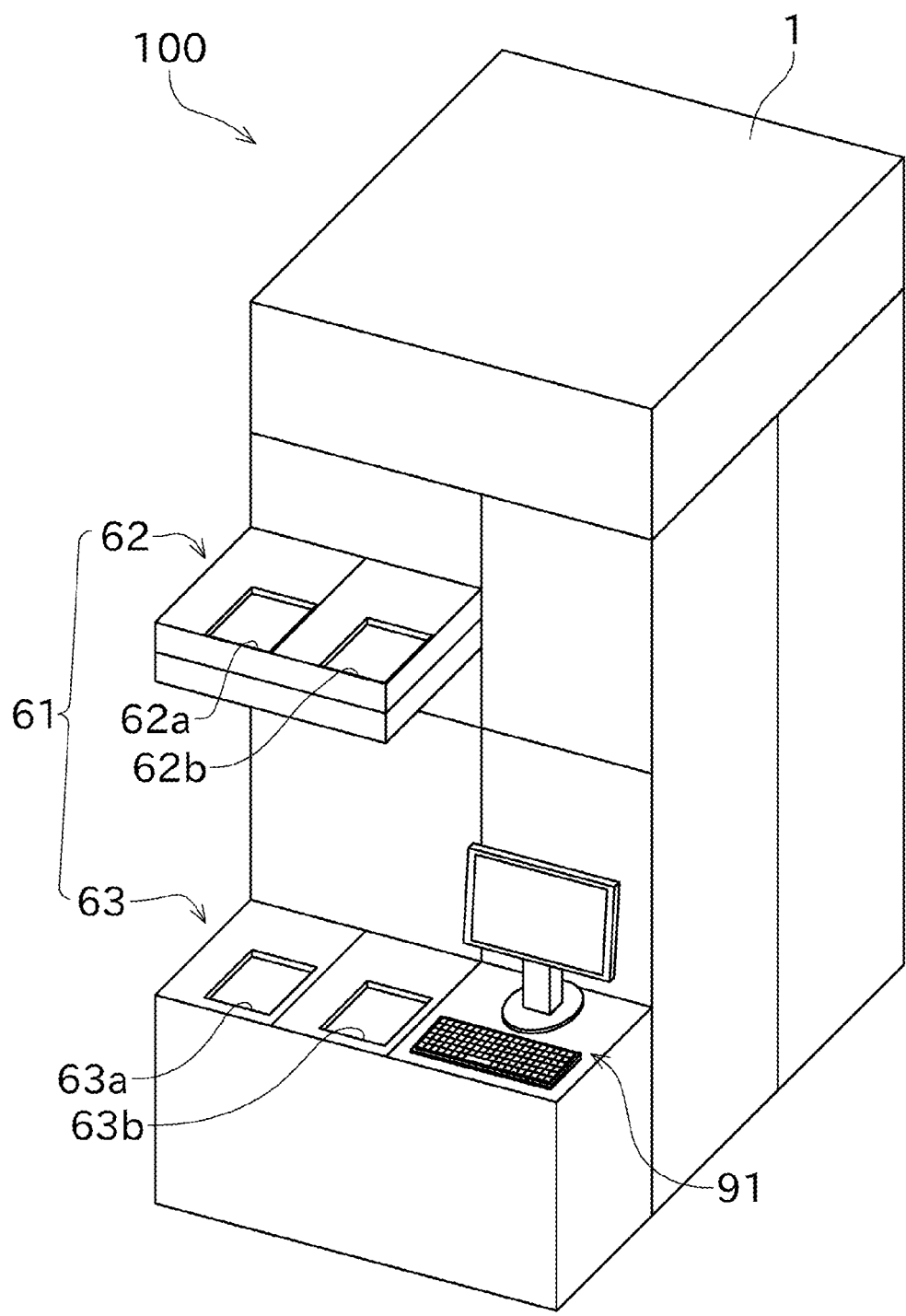
FIG. 1 shows an external perspective view showing a configuration of a storage apparatus according to a first example.

REFERENCE SIGNS LIST 1 housing
11 base stand (fixed part)
14 power-transmission unit
31 reticle storage shelf
32 rotating shelf
33 detection device (power drive device)
34 power-receiving unit
81 motor
100 storage apparatus

DETAILED DESCRIPTION

Figure 2:
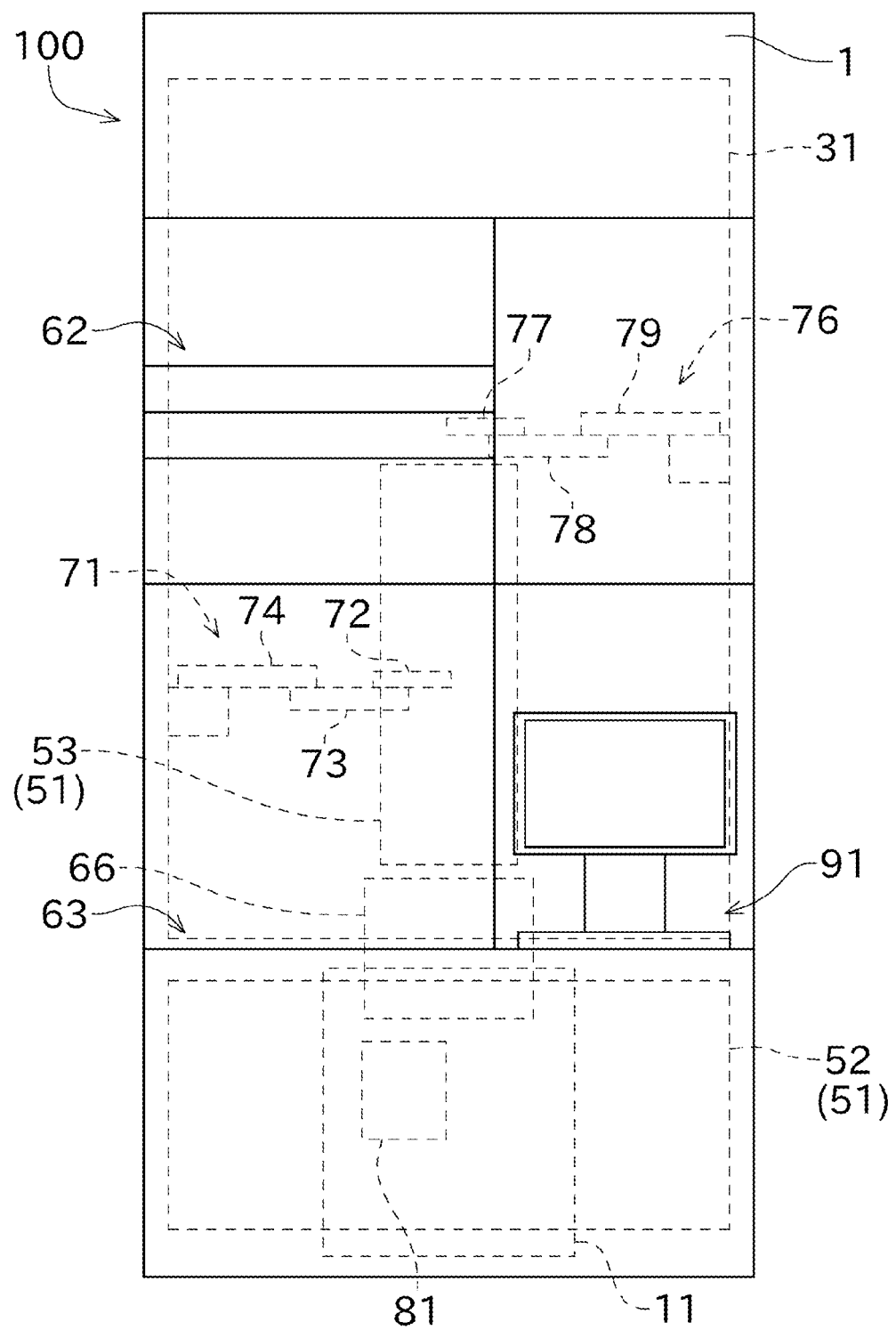
FIG. 2 shows a front view of a storage apparatus.
Figure 3:
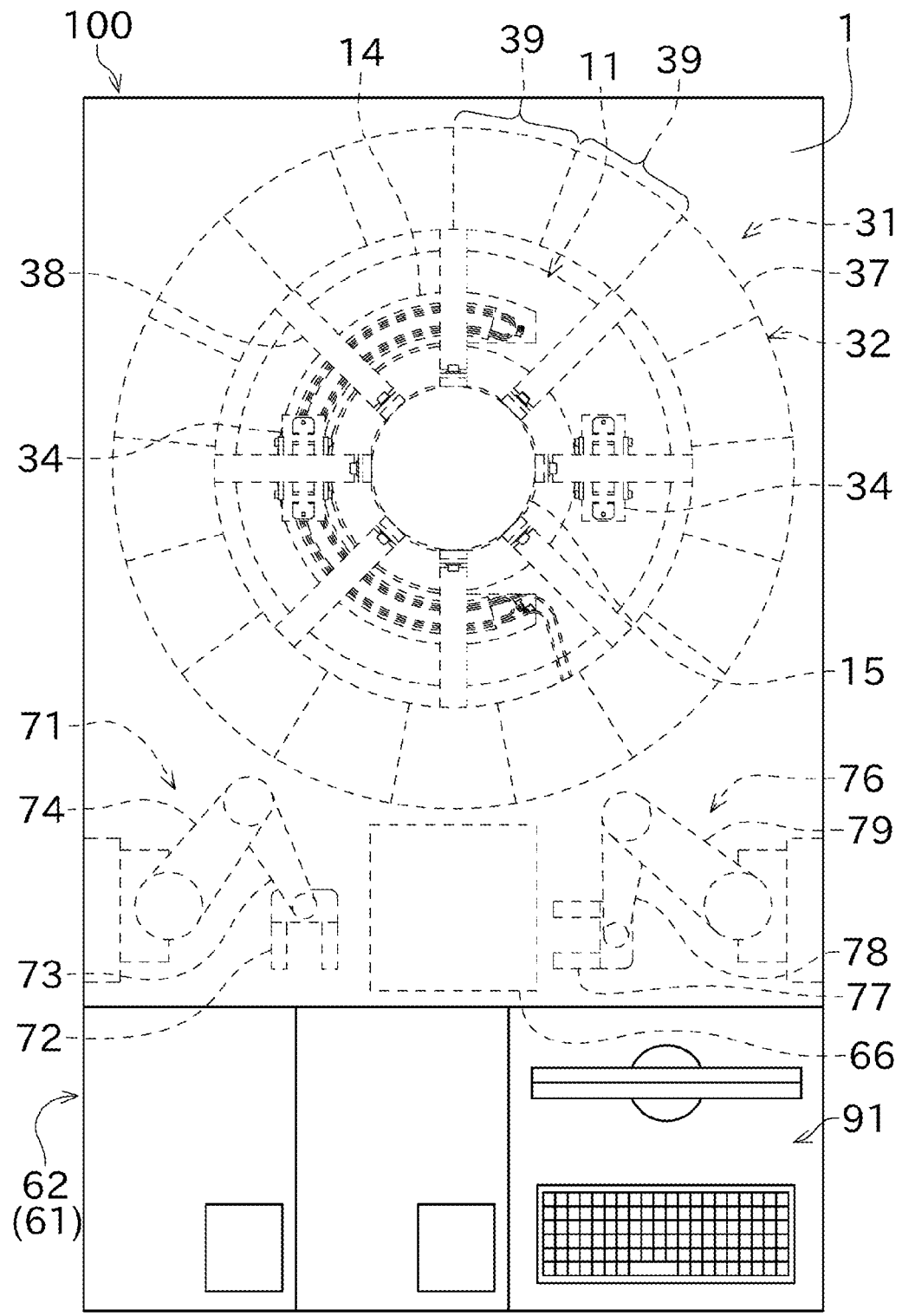
FIG. 3 shows a plan view of a storage apparatus.
Figure 4:
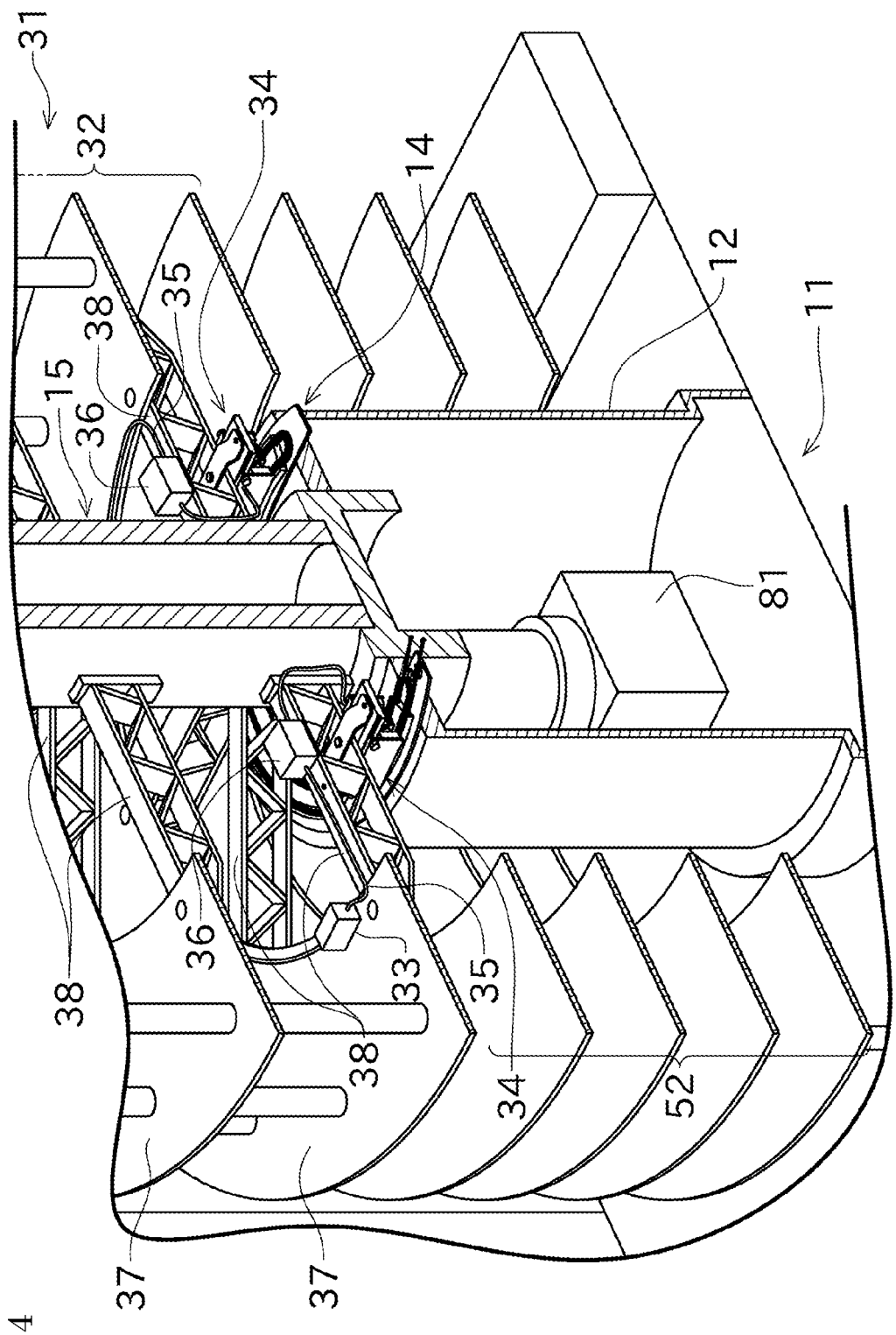
FIG. 4 shows a sectional perspective view showing the details of that a reticle storage unit in a housing and the configuration for their driving.

Next, an example will now be described with reference to the drawings. FIG. 1 is an external perspective view showing a configuration of a storage apparatus 100 according to an example. FIG. 2 is a front view of the storage apparatus 100. FIG. 3 is a plan view of the storage apparatus 100. FIG. 4 is a sectional perspective view showing the details of that a reticle storage unit 31 in a housing 1 and the configuration for their driving.

The storage apparatus 100 in the first example as shown in FIG. 1, is placed in a clean room such as a semiconductor integrated circuit factory or a liquid crystal substrate factory, and is used to store a reticle (tool) for exposure of a semiconductor or a liquid crystal substrate. The storage apparatus 100, as shown in FIGS. 1. to 3, is mainly furnished with the housing 1, a base stand (fixed part) 11, a reticle storage shelf (rotating part) 31, a case storage shelf 51 and a motor (rotating shaft driving part) 81.

The housing 1, made from a metal plate, for example, is formed with a hollow approximately parallelepiped shape. Inside the housing 1, a storage space having a sealing property with outside is formed.

The storage apparatus 100 includes a purge device (not shown). This purge device can prevent contamination of reticles housed by filling a purge gas in the storage space inside the housing 1. As for the purge gas, for example, clean and dry air or nitrogen gas are included, but is not particularly limited.

The base stand 11 is disposed at the lower part in the storage space and fixed in the housing 1 as shown in FIG. 2. The base stand 11 includes a support case 12 and a power-transmission unit 14 as shown in FIG. 4.

The support case 12 is formed with a hollow cylindrical shape in which its axis is directed towards the vertical direction. The support case 12 having a shape which its upper end is closed. In the center upper surface of the support case 12, the rotating shaft 15 extending in the vertical direction is rotatably supported with its axis as the center.

The power-transmission unit 14 is mounted on the upper surface of the support case 12. The power-transmission unit 14 can be transmitted electric power in non-contact state to the later-described power-receiving unit 34 mounted in the reticle storage shelf 31. In addition, the detail of the configuration of the power-transmission unit 14 is described below.

The reticle storage shelf 31 stores a large number of reticles. As shown in FIG. 4, the reticle storage shelf 31 includes a rotating shelf 32, a detection apparatus (power drive device) 33 and a power-receiving unit 34. The reticle storage shelf 31 is disposed at a position higher than the base stand 11 and configured to rotate with the rotation of the rotating shaft 15.

The rotating shelf 32 includes a plurality of shelf boards 37 disposed with a gap in the vertical direction. The respective shelf boards 37 are formed in a hollow ring shape. The shelf boards 37 are mounted to the rotating shaft 15 by a plurality of support beams 38 radially fixed to the rotating shaft 15. The support beam 38, for example, eight per one shelf board 37 is arranged and disposed at front and rear positions with equal intervals in the circumferential direction. The shaft 15 is rotationally driven with a motor 81 described below and then the plurality of shelf boards 37 simultaneously rotates. Accordingly, the rotation phase can be changed so that the rotating shelf 32 is oriented in a desired direction. The rotating shaft 15 can rotate in normal and reverse directions.

As shown in FIG. 3, a plurality of storage areas 39 are defined such that the storage space on the upper side of the respective shelf boards 37 is divided into a plurality in the circumferential direction. Although not shown, in the respective storage areas 39, a reticle storage module formed in a hollow box shaped is placed on the shelf board 37. In the reticle storage module, reticles are stored with vertically arranged in line. It is possible to freely moved in or out the respective reticles from the reticle storage module as necessary.

By appropriate rotating the rotating shelf 32, the rotation phase of the storage area 39 where the specific reticle storage module is disposed can be adjusted the position of the shelf board 37 to align the accessible rotation phase with a reticle transport device 76 described below. These conditions, using the reticle transport device 76, a desired reticle can be freely pulled out or put in the reticle storage module.

A detection device 33 shown in FIG. 4, for example, is fixed to the shelf board 37, and can acquire the information related to a storage state such as a temperature and a humidity in the reticle storage shelf 31 and a posture of the reticle storage module. Examples of the detection device 33, include a known temperature sensor, a humidity sensor, a camera, a gas component detector and the like, however, without being limited. The position and number of the detection device 33 disposed on the rotating shelf 32 can be arbitrarily determined with the circumstances. The detection device 33 rotates integrally with the rotating shelf 32 accompanied with the rotating shelf 32 rotates. The detection device 33 is driven by the electric power supplied from the power-receiving unit 34 through a cable 35.

The detection device 33 transmits the detected information to an apparatus and the like (for example, the terminal device 91 shown in FIG. 1) disposed outside of the storage apparatus 100 by wireless communication. The wireless communication may be implemented according to a known standard such as a wireless LAN, for example. This configuration allows the administrator of the storage apparatus device 100 to easily confirm the storage state of the reticle storage shelf 31 from the outside on the display or the like of the terminal device 91.

As shown in FIG. 4, the power-receiving unit 34 is mounted in a downward direction to a support beam 38 supporting a shelf board 37 at lowermost providing the rotating shelf 32. The power-receiving unit 34 obtain an electric power by a wireless from the power-transmission unit 14 and then supplies the electric power to the detection device 33 through the cable 35.

As shown in FIG. 2, the case storage shelf 51 includes a storage shelf 52 and a buffer shelf 53. The storage shelf 52 and the buffer shelf 53 can be stored a transfer case (not shown) and used to convey the reticle. The storage shelf 52 is formed with a cylindrical shape as a whole, and disposed lower the reticle storage shelf 31 as shown in FIG. 4. This storage shelf 52 includes a plurality of shelf boards disposed in the vertical direction. These shelf boards will rotate by motor (not shown). As shown in FIG. 2, the buffer shelf 53 is fixed immediately above a case opening device 66 described below. This buffer shelf 53 is used for the purpose of temporarily storing a transport case waiting for processing in the case opening device 66, for example.

For example, the motor 81 is provided of an electric motor, and fixed inside the support case 12. The electric power for driving the motor 81 is supplied from the electric power source (not shown) using a cable. The driving force of the motor 81 is transmitted to the rotating shaft 15 by an appropriate driving transmission mechanism, and then the rotating shaft 15 is driven.

The storage apparatus 100 includes a delivery port 61, the case opening device 66, a case transport device 71 and the reticle transport device 76 in addition to the housing 1, the reticle storage shelf 31 and the case storage shelf 51.

As shown in FIG. 1, the delivery port 61 includes an upper port 62 and a lower port 63.

The upper port 62 is disposed somewhat upward of the front of the housing 1. The upper port 62 having two openings 62a and 62b of which the upper surfaces are capable of opening. The storage apparatus 100 can be delivered, the transfer case holding a reticle from an overhead transfer vehicle (not shown) through the openings 62a and 62b.

The lower port 63 is disposed lower than the upper port 62 in the front of the housing 1. The lower port 63 has two openings 63a and 63b of which the upper surfaces are capable of opening. The storage apparatus 100 can be delivered to the transfer case holding a reticle from an operator or a robot and the like through the openings 63a and 63b.

The transport case transported to the delivery port 61 will be transported by the case transport device 71 to the case opening device 66 or the case storage shelf 51.

The case opening device 66 is disposed in the above storage space, which ensures a state where the internal reticle can be taken out after opening the transport case.

As shown in FIG. 3, the case transport device 71 is disposed on the side close to the delivery port 61 in the storage space. The case transport device 71 is composed as an articulated arm robot includes a hand 72 and two arms 73 and 74 or the like. Furthermore, the case transport device 71 can move in the vertical direction by driving a motor (not shown).

The case transport device 71 can transport the transport case among the upper port 62 or the lower port 63, the case opening device 66, and the case storage shelf 51, by operating the hand 72 and the arms 73 and 74 while rise and fall as needed.

As shown in FIG. 3, the reticle transport device 76 is disposed in the above-storage space at a position facing the case transport device 71 to interpose the case opening device 66 in planar view. As with the case transport device 71, the reticle transport device 76 is composed as an articulated arm robot includes a hand 77 and two arms 78 and 79. Furthermore, the reticle transport device 76 can move in the vertical direction by driving a motor (not shown).

The reticle transport device 76 can transport a reticle between the case opening device 66 and the reticle storage shelf 31 by operating the hand 77 and the arms 78 and 79 while rise and fall as needed.

Figure 5:
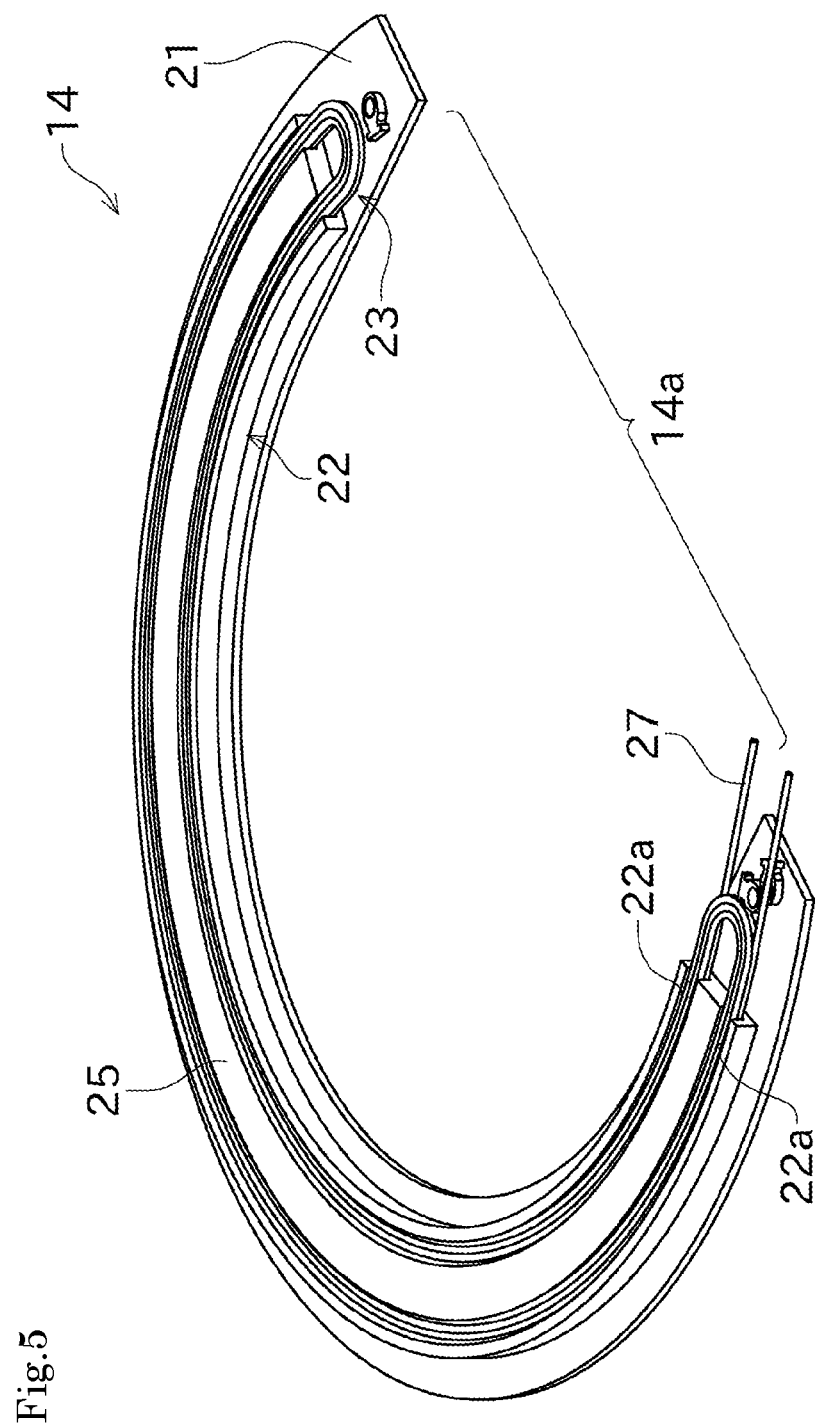
FIG. 5 shows a perspective view showing the configuration of a power-transmission unit.
Figure 6:
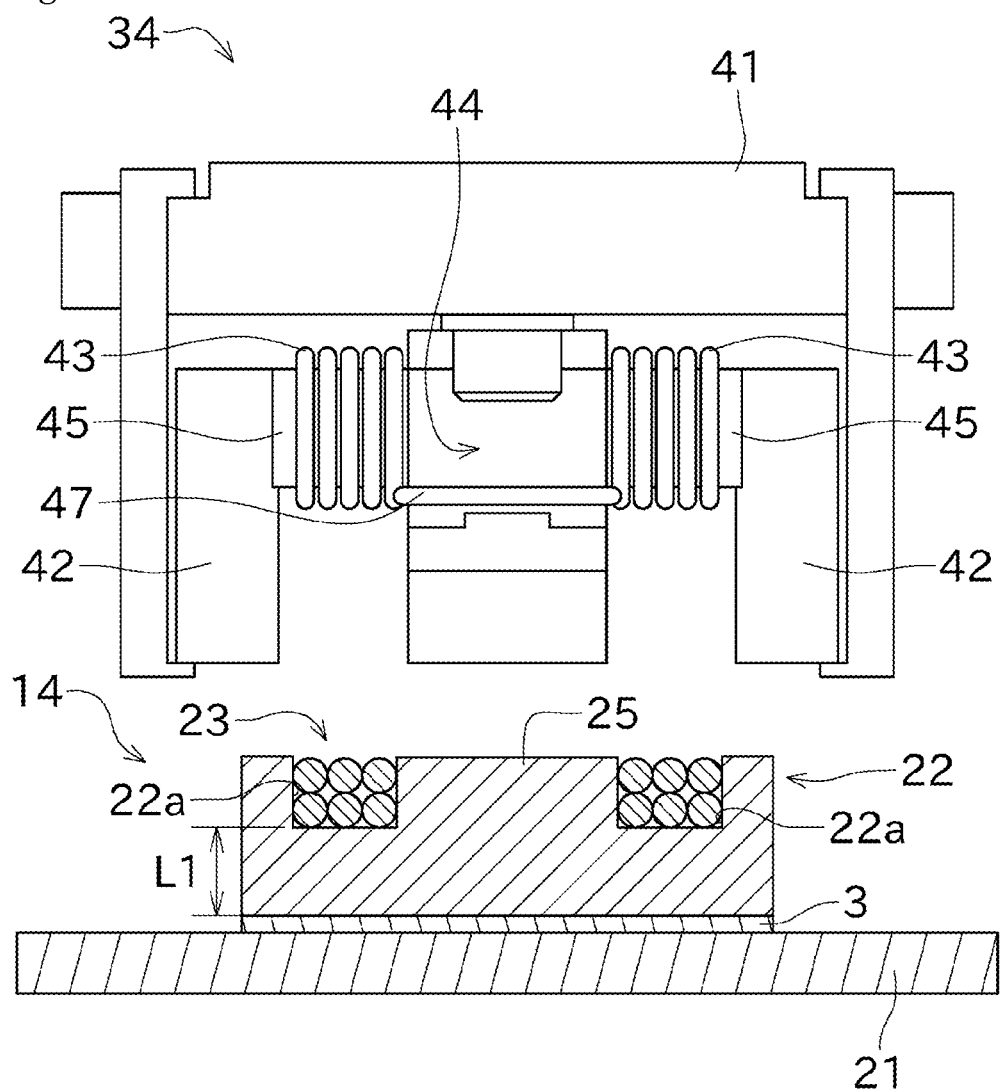
FIG. 6 shows a sectional view showing the configuration of a power-transmission unit and a power-receiving unit.
Figure 7:
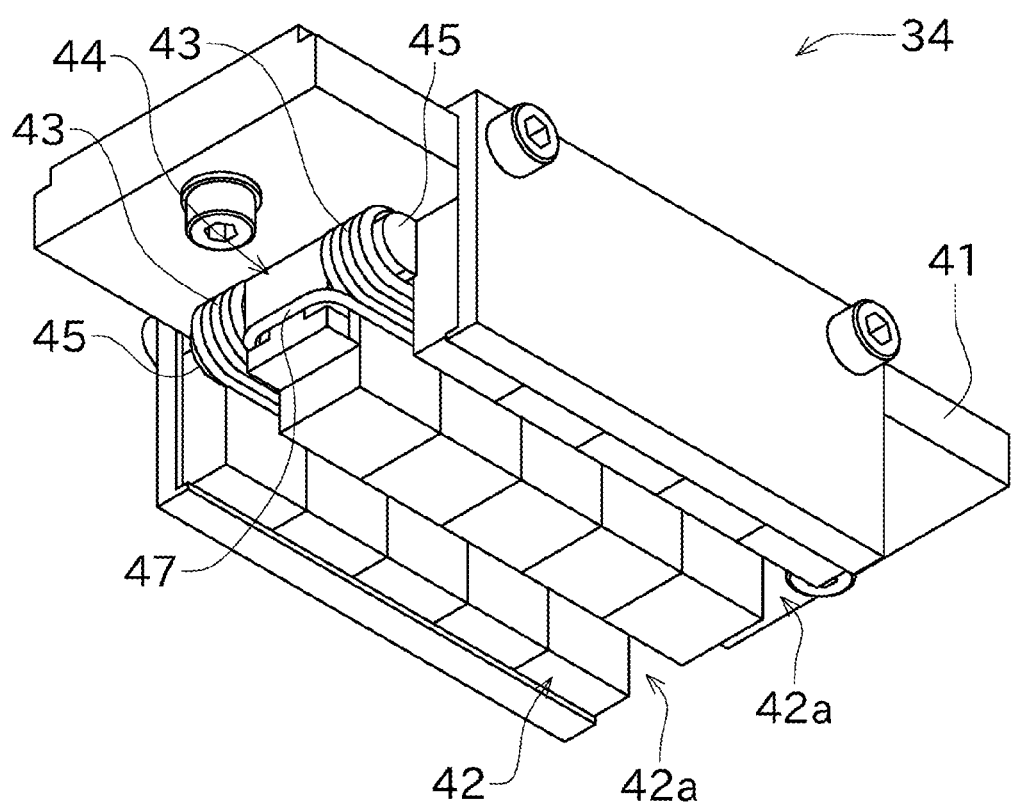
FIG. 7 shows a perspective view showing the configuration of a power-receiving unit.
Figure 8:
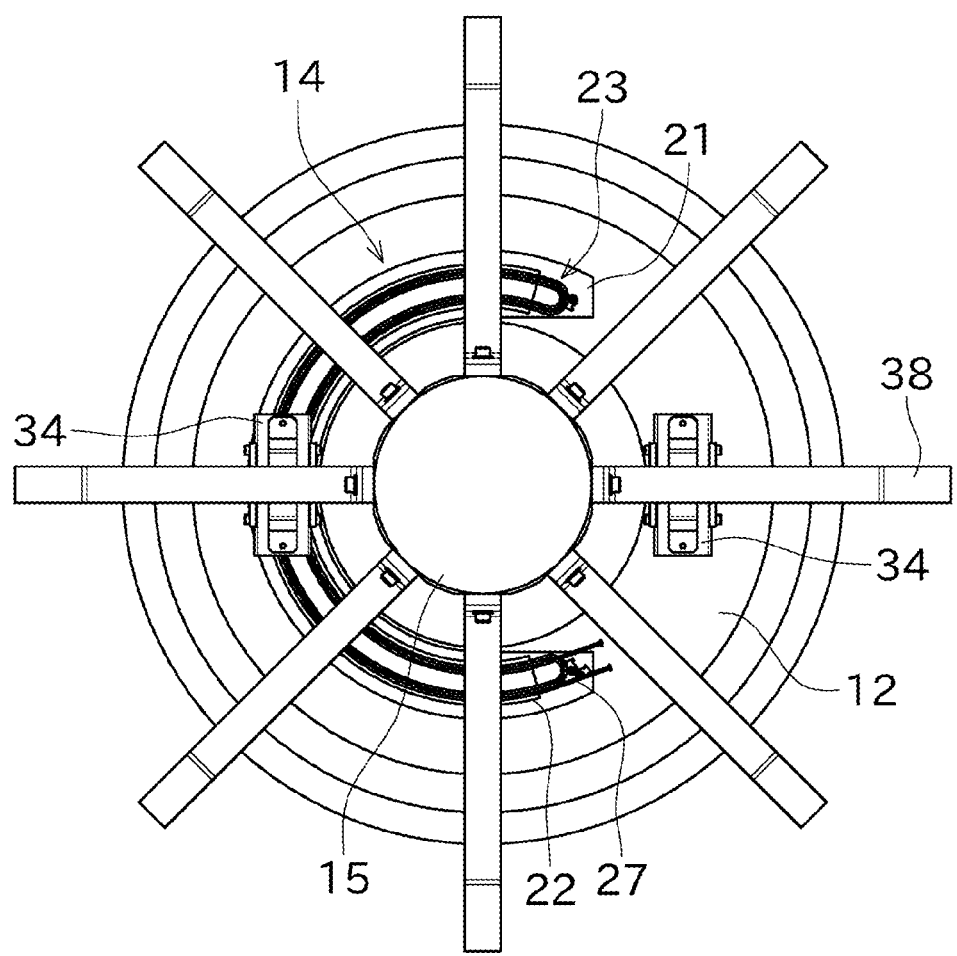
FIG. 8 shows a part plan view showing the configuration of a stable wireless power supply.
Figure 9:
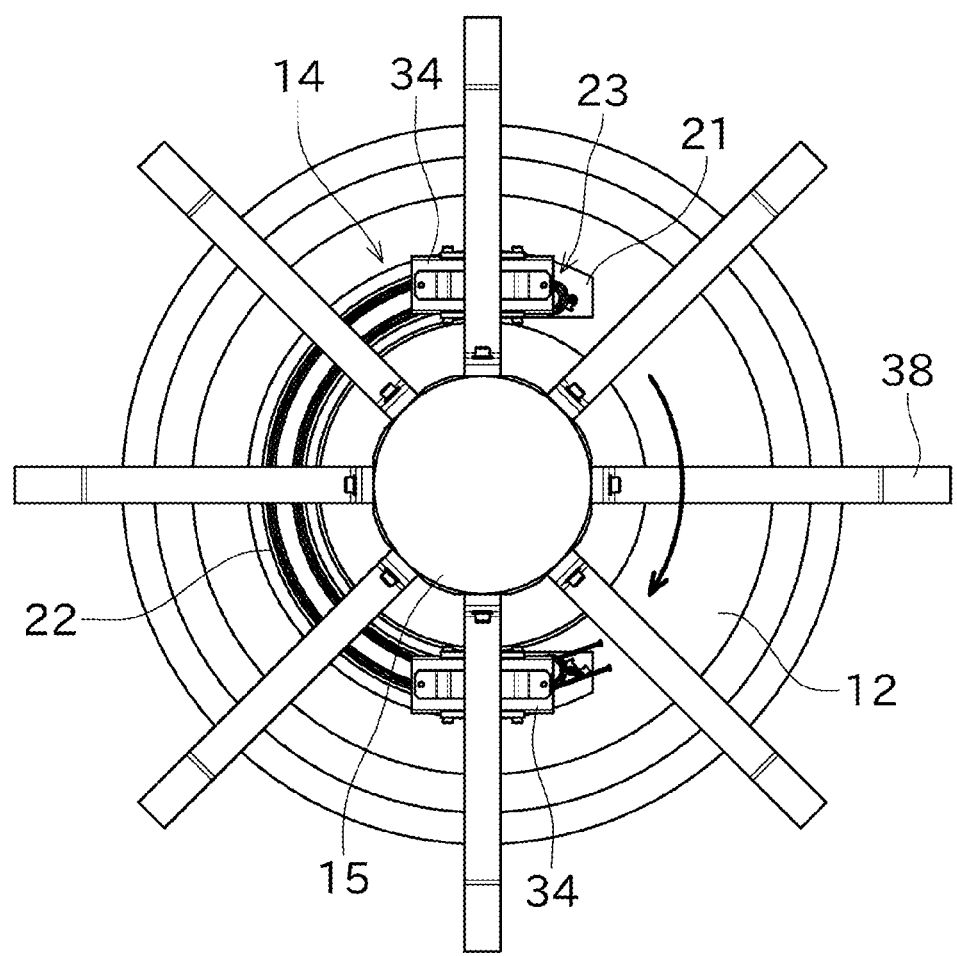
FIG. 9 shows a part plan view showing a state that the rotating shelf has rotated from the state of FIG. 8.

To continue, a wireless power supply structure for supplying electric power to the detection device 33 disposed on the reticle storage shelf 31 is described in detail with reference to FIGS. 4 to 9. FIG. 5 is a perspective view showing the configuration of the power-transmission unit 14. FIG. 6 is a sectional view showing the configuration of the power-transmission unit 14 and the power-receiving unit 34. FIG. 7 is a perspective view showing the configuration of the power-receiving unit 34. FIG. 8 is a part plan view showing the configuration of the wireless power supply. FIG. 9 is part plan view showing a state that the rotating shelf 32 has rotated from the state of FIG. 8. Moreover, FIGS. 8 and 9 show a state in which the shelf board 37 is removed from the rotating shelf 32.

As shown in FIG. 4, the wireless power supply structure includes the power-transmission unit 14 mounted on upper portion of the support case 12 in the base stand 11 and a plurality of (two power-receiving units 34 in the example) power-receiving units 34 mounted on lowermost support beam 38 in the reticle storage shelf 31.

As shown in FIGS. 4 and 5, the power-transmission unit 14 is formed in a circle arc shape having an opening 14a which along a circumferential direction of the rotating shaft 15. The power-transmission unit 14 having a base plate (base member) 21, a winding support block (support) 22 and a primary coil 23. Although not shown in FIGS. 4 and 5, as shown in FIG. 6, the power-transmission unit 14 further has a magnetic sheet 3.

For example, the base plate 21 is formed in a slender plate shape of approximately circle arc made of a non-magnetic material such as aluminum metal. The base plate 21 is formed into a thin plate having a thickness of about several mms and the like. The base plate 21 is detachably mounted to the upper surface of the support case 12 by fixing member (for example, screws) not shown.

A winding support block 22 is formed in a slender plate shape of approximately circle arc as with the base plate 21 and fixed to an upper surface of the magnetic sheet 3 described below. For example, the winding support block 22 is formed by injection molding of a synthetic resin. As shown in FIG. 5, in the upper surface of the winding support block 22, two rail portions 22a formed thin and long in the circumferential direction are formed.

The respective rail portions 22a are composed as a mortise groove whose upper side (near the power-receiving unit 34) is opened and formed over the whole circumferential direction of the winding support block 22 formed in a circle arc shape. The primary coil 23 can be accommodated in the mortise groove. The two rail portions 22a are disposed in a concentric circle arc shape. As a result, the upper surface of the winding support block 22, a relatively convex arc-shaped convex portion (conductor guiding part) 25 between the inner circumferential side rail portion 22a and the outer circumferential side rail portion 22a) is provided.

The primary coil 23 is formed by winding a slender litz wire (conductor) 27 as a good conductor of electricity along the rail portion 22a. Specifically, as shown in FIG. 5, after disposing the litz wire 27 toward the other end side from one end side in the circumferential direction of the winding support block 22 along the single rail portion 22a, it is folded in the other end side to disposed along the other rail portion 22a, and then folded back again at the one end side. In this manner, the primary coil 23 is being formed by revolving plural times the litz wire 27 in the convex portion 25 while alternately providing the litz wire 27 on the two rail portions 22a. In the primary coil 23, an alternating current can flow from an inverter (not shown).

In this example, the litz wire 27 is wound so that a plurality of layers in the vertical direction is formed and revolving plural times about the convex portion 25 in each layer. This enables a strong magnetic flux to be generated with a compact configuration.

The opening 14a is formed in the size that make it possible to pass the rotating shaft 15. In detail, the distance between both ends of the base plate 21 is formed to be substantially equal to the diameter of the rotating shaft 15. Thereby, the rotating shaft 15 is capable of insertion into or out of the power-transmission unit 14 through the opening 14a. Consequently, the facilitated attaching/detaching of the power-transmission unit 14 leads to improved maintainability. Moreover, it is easy to mount the power-transmission unit 14 for retrofitting to an existing storage apparatus.

The magnetic sheet 3 is formed in a slender sheet shape of approximately circle arc as with the base plate 21, and fixed to an upper surface of the base plate 21. The magnetic sheet 3 is made of an appropriate magnetic material and formed in a thin sheet shape. The thickness of the magnetic sheet 3 can be 1 mm or less, for example.

As shown in FIG. 6, the magnetic sheet 3 is provided in the downward direction of the winding support block 22 and upward direction of the base plate 21 to be interposed between the primary coil 23 and the base plate 21.

The magnetic sheet 3 provided as above serves as a back yoke and it is possible to prevent the magnetic flux generated in the energization primary coil 23 from leaking downwardly to thereby concentrate it upwardly. As a result, a strong magnetic field can be generated on the power-receiving unit 34 side. In addition, the effect of a magnetic flux intercepting of the magnetic sheet 3 can prevent an eddy current generated in the base plate 21. Thus, the eddy current loss in the base plate 21 is suppressed, and the power transmission efficiency of the power-transmission unit 14 can be improved.

The winding support block 22 (specifically, a portion corresponding to the bottom of the rail portion 22a) is disposed between the primary coil 23 and the magnetic sheet 3. It is preferable that the portion is formed to have a certain thickness. As shown in FIG. 6, it is possible that the length L1 from the inner base surface of the rail portion 22a to the base surface of the winding support block 22 may be several mms, for example. Only the length L1 is disposed between the primary coil 23 and the magnetic sheet 3.

As shown in FIG. 7, as a perspective view seen from below, the power-receiving unit 34 includes a base block (base member) 41, a magnetic core 42 and a secondary coil 43.

A base block 41 is formed of a resin and the like. The magnetic core 42 is made of a ferrite core and the like, and fixed at the lower part of the base block 41. The magnetic core 42 is formed in the horizontal position E-shape, and of that base surface, the mortise grooves 42a which has two linear shapes opened downward are formed. The secondary coil 43 is formed by winding an electric wire (conductive component) 47 around the above-described magnetic core 42.

A winding guide member 44 is fixed in the base surface of the base block 41. As shown in FIG. 7, although only one winding guide member 44 is provided, the winding guide members 44 are disposed at both ends of the magnetic core 42 in the longitudinal direction of the mortise grooves 42a, respectively. Each winding guide member 44 has a turn guide 45. An electric wire 47 constituting of the secondary coil 43 can be wound around the turn guide 45.

The secondary coil 43 is disposed corresponding to the respective mortise grooves 42a. Namely, as shown in FIG. 7, the secondary coil 43 is formed by winding the electric wire 47 around the mortise grooves 42a in the magnetic core 42.

With the above configuration, when flowing an alternating current through the primary coil 23 of the power-transmission unit 14, in the power-receiving unit 34 facing in vertical direction against the power-transmission unit 14, an induced current will flow into the secondary coil 43. Under these conditions, it is possible to supply electric power to the power-receiving unit 34 in a non-contact state from the power-transmission unit 14.

In the wireless power supply structure in the example, as shown in FIG. 8, the power-transmission unit 14 is fixed to the upper surface of the support case 12 to surround the outer circumferential of the rotating shaft 15. On the other hand, the two power-receiving units 34 is in the position where the rotation phases are different from each other by 180° about the rotating shaft 15, and its longitudinal direction is formed to be parallel to the tangential direction of the primary coil 23. In other words, a circle that is a rotation locus of the power-receiving unit 34 of the power-transmission unit 14 are mounted on the downward direction to the support beam 38 of the reticle storage shelf 31.

The power-transmission unit 14 is formed in a circle arc shape, and its central angle defines an angle slightly larger than 180°. Accordingly, the large opening 14a that make it possible to pass the rotating shaft 15 is formed in the power-transmission unit 14. In addition, as shown in FIGS. 8 and 9, even when the opening 14a is formed in the power-transmission unit 14 as described above, the power-transmission unit 14 can be transmitted electric power always facing at least one of the power-receiving units 34 in the vertical direction. In this condition, regardless of the rotation phase of the rotating shelf 32, a stable wireless power supply can be realized.

The detection device 33 shown in FIG. 4 is electrically connected to both two power-receiving units 34 by a cable 35. Furthermore, the alternating current outputted from the power-receiving unit 34 is converted into a direct current by the rectifier 36. The rectifier 36 is mounted to rotate with the rotating shaft 15. Although FIG. 4 shows an example in which the rectifier 36 is mounted to the support beam 38, the position of the rectifier 36 can be changed as appropriate. As a result, an electric power can be supplied to detection device 33 from any one of the power-receiving units 34. As described above, since the wireless power supply structure is disposed between the base stand 11 and the rotating shelf 32 that relatively rotated to each other, even if the rotating shelf 32 rotates, the electric wire is not twisted, and then a stable electric power can supply to the detection device 33.

As described above, the storage apparatus 100 of the example includes the housing 1, the base stand 11, the reticle storage shelf 31 and the motor 81. The base stand 11 is disposed in the housing 1 and fixed its position against the housing. The reticle storage shelf 31 is connected to the fixed part through the rotating shaft 15 extending in the vertical direction 15 and rotates relatively to the base stand 11 as a center of the rotating shaft 15. The motor 81 rotates the rotating shaft 15. The base stand 11 includes a power-transmission unit 14 that transmits electric power in non-contact state. The reticle storage shelf 31 includes the rotating shelf 32, the detection device 33 and the power-receiving unit 34. A reticle is disposed on the rotating shelf 32. The detection device 33 is disposed to rotate integrally with the rotating shelf 32 and driven by electric power. The power-receiving unit 34 supplies the electric power transmitted from the power-transmission unit 14 to the detection device 33.

This enables a wireless power feeding to the detection device 33 disposed on the rotating reticle storage shelf 31.

In the storage apparatus 100 of the example, the power-transmission unit 14 includes the winding support block 22 and the litz wire 27. The winding support block 22 surrounds parts of the outer peripheries of the rotating shaft 15. The litz wire 27 is disposed on the winding support block 22 along the direction in which the winding support block 22 extends. The power-receiving unit 34 includes the secondary coil 43 formed by winding the electric wire 47. When a magnetic field generated by flowing a current through the litz wire 27 of the power-transmission unit 14, an induced current is generated in the secondary coil 43 of the power-receiving unit 34.

In this way, it is possible to realize a wireless power supply with a simple configuration.

Further, in the storage apparatus 100 of the example, the winding support block 22 has a convex portion 25 formed to extend in the circumferential direction. The litz wire 27 is disposed along the convex portion 25. In this way, the power-transmission unit 14 can be realized with a simple configuration.

In addition, in the storage apparatus 100 of the example, the power-transmission unit 14 includes the magnetic sheet 3 provided on the side opposite to the side where the litz wire 27 and the power-receiving unit 34 face each other.

This enables the magnetic sheet to serve as a back yoke, which allows an energized magnetic flux so that the energized litz wire 27 can be concentrated on the power-receiving unit 34 side. This enables the power-transmission 14 efficiency of the power-transmission unit to be improved with a compact configuration.

Furthermore, in the storage apparatus 100 of the example, the winding support block 22 as the other member is disposed between the litz wire 27 and the magnetic sheet 3.

This allows the distance between the litz wire 27 and the magnetic sheet 3 to be simply separated and it is possible to prevent the magnetic flux in litz wire 27 from flowing to the side opposite to the power-receiving unit 34.

The storage apparatus 100 of the example includes the two power-receiving units 34 disposed on the circumference around the rotating shaft 15. The power-transmission unit 14 is disposed to face the rotation track of the power-receiving unit 34. When viewed in a direction parallel to the rotating shaft 15, the power-transmission unit 14 is formed in a circle arc shape having the opening 14a which along a circumferential direction of the rotating shaft 15, and disposed always overlap at least one of the power-receiving unit 34.

In this way, it is possible to realize miniaturization of a power-transmission unit 14 and a stable wireless power supply.

Furthermore, in the storage apparatus 100 of this example, the opening 14a in the power-transmission unit 14 is formed in the size that make it possible to pass the rotating shaft 15. The power-transmission unit 14 is detachably mounted to an outer circumferential side of the rotating shaft 15.

Consequently, the facilitated attaching/detaching of the power-transmission unit 14 leads to improved maintenance work.

In addition, the storage apparatus 100 of this example, the detection device 33 can be provided as a temperature sensor, a humidity sensor or a camera and the like.

Thereby, it is possible to readily obtain the information related to the storage condition and the like in the rotating shelf 32 using the detection device 33.

Figure 10:
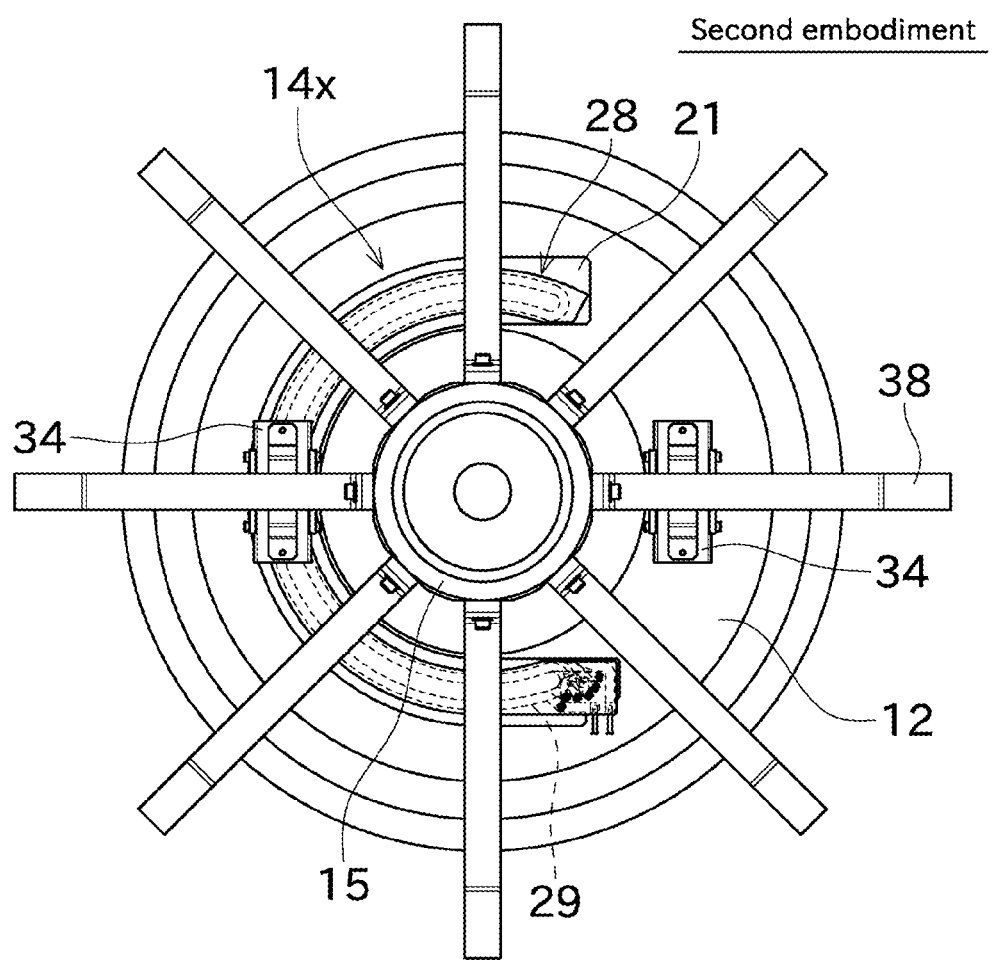
FIG. 10 shows a part plan view showing the configuration of a wireless power supply in a second example.
Figure 11:
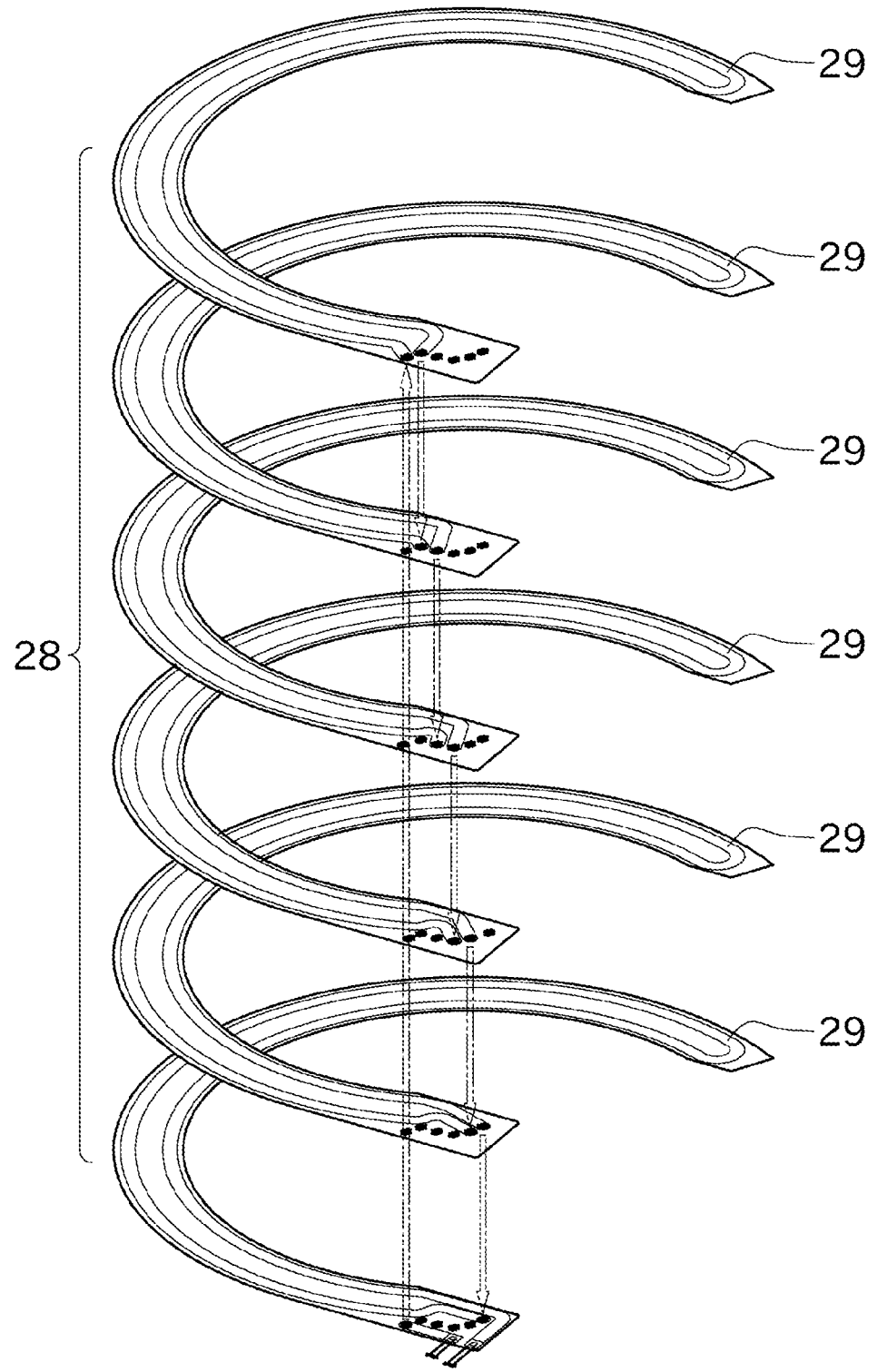
FIG. 11 shows a perspective view showing the configuration of a circuit pattern of a multilayer board in a second example.
Figure 12:
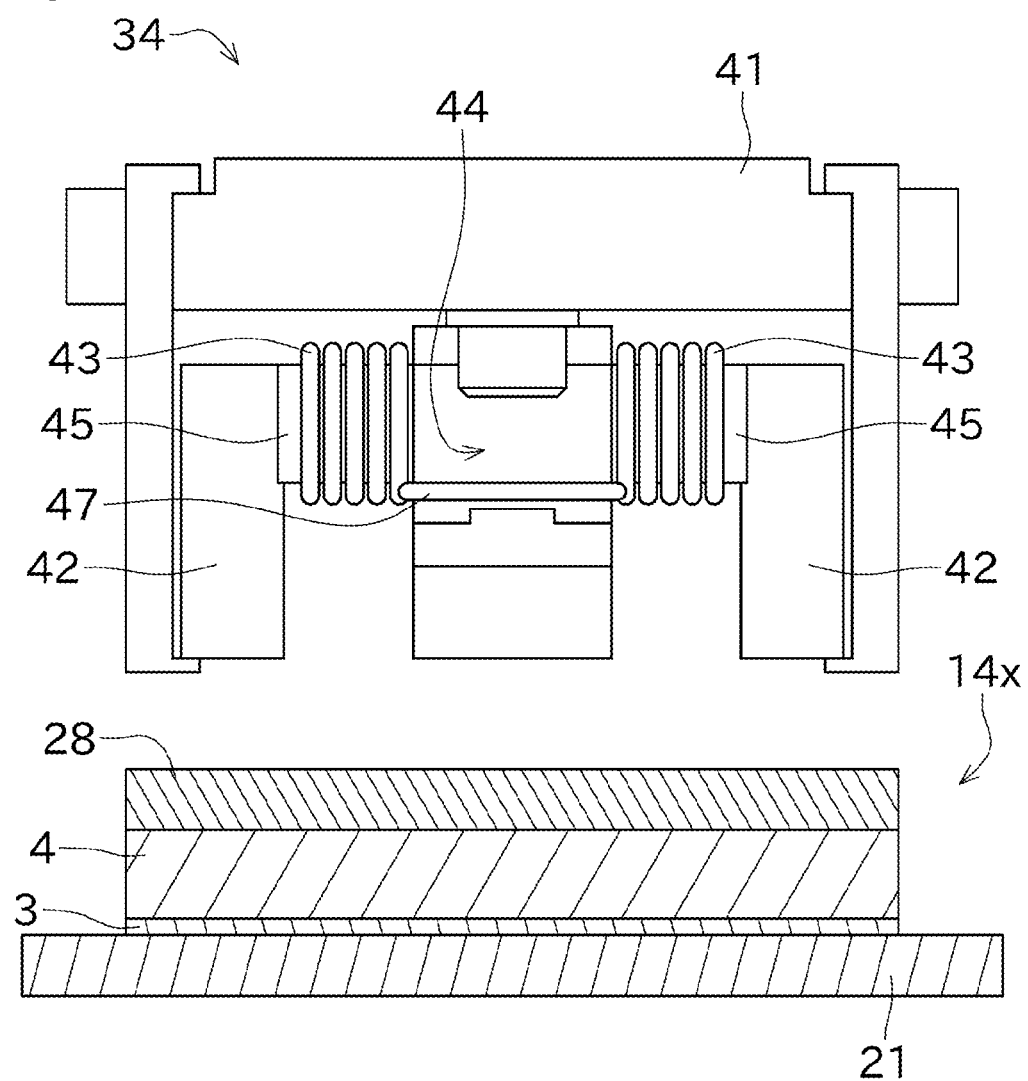
FIG. 12 shows a sectional view showing the configuration of a power-transmission unit and a power-receiving unit in a second example.

Next, a second example will be described. FIG. 10 is a part plan view showing the configuration of the wireless power supply having a power-transmission unit 14x of the second example. FIG. 11 is a perspective view showing the configuration of the circuit pattern 29 in the multilayer board 28 of the second example. FIG. 12 is a side perspective view showing a configuration of the power-transmission unit 14x and power-receiving unit 34 of the second example. Further, in the description of this example, members that are the identical or similar as those of the above-described example are given the same reference numerals in the figures, and description thereof may be omitted.

As shown in FIG. 10, the power-transmission unit 14x of this example includes the base plate 21, the magnetic sheet 3, the multilayer board (printed board) 28 and a resin plate (plate member) 4. Specifically, in the multilayer board 28, a board made of, for example, glass fiber corresponds to a support, and then the circuit pattern 29 formed of, for example, copper foil on the surface of that substrate corresponds to a conductor.

The multilayer board 28 is disposed on the resin plate 4 provided on the magnetic sheet 3. In this example, the multilayer board 28 is composed as a six-layers board, and the circuit pattern 29 of each layer is formed in slender loop shape that reciprocates along an arc shape of the outer shape of the multilayer board 28 as shown in FIG. 11. The circuit pattern 29 of each layer is electrically connected to upper side or lower side of the circuit pattern 29 via a through hole. This enables a six-turn primary coil to be formed.

As shown in FIG. 11, the resin plate 4 is provided in the downward direction of the multilayer board 28 and the upward direction of the base plate 21 to be interposed between the multilayer board 28 and the magnetic sheet 3. The resin plate 4 is made of a resin of non-magnetic material with a low magnetic permeability. This resin is a non-conductive material. The resin plate 4 has a predetermined thickness and is formed in a plate shape having the same shape as the multilayer board 28 in a planar view. The magnetic sheet 3 is disposed on one side of the resin plate 4 in the thickness direction, and the multilayer board 28 is disposed on the other side. It is possible that the thickness of the resin plate 4 may be several mms, for example.

In this way, in this example, the power-transmission unit 14x having the function the same as the first example can be configured by a printed circuit board and it is possible to realize a cost reduction and a compact configuration.

Further, in this example, since the resin plate 4 is disposed between the multilayer board 28 and the magnetic sheet 3, it is possible to suppress the magnetic flux generated by the circuit pattern 29 from flowing to the side opposite to the power-receiving unit 34 with a compact configuration. Thereby, the hysteresis loss in the magnetic sheet 3 and the eddy current loss in the base plate 21 are suppressed and power-transmission efficiency can be improved.

While preferred examples and variations have been described above, the above configurations may be modified, for example, as follows.

Although the reticle storage shelf 31 is configured to rotate integrally as a whole, it is not limited to this and, for example, it may be configured to rotate for every shelf board 37. In this example, the above wireless power supply structure may be disposed between the respective shelf boards 37.

In the winding support block 22, the configuration may be such that the mortise groove-shaped rail portion 22a is omitted and the convex portion 25 may be changed to the simple configuration in which a convex shape to be formed. In that configuration, the primary coil 23 is formed by disposing (wrapping) the litz wire 27 along the convex portion 25.

In the power-transmission unit 14, the litz wire 27 may be disposed to reciprocate along the winding support block 22 while turning only once instead of rotating a plurality of times around the litz wire. And, also, it is possible to form the primary coil 23 having one-turn.

The number of turns of the primary coil 23 in the power-transmission unit 14 and secondary coil 43 in the power-reception unit 34 can be appropriately changed, respectively.

The detection device 33 can be fixed to, for example, the support beam 38 of which an appropriate portion of the rotating shelf 32.

Also, a battery capable of temporarily storing electric power may be provided to the reticle storage shelf 31. In this configuration, the electric power is to be supplied from the battery to the detection device 33 by charging the battery with the power supplied from the power-receiving unit 34.

The power-transmission units 14 and 14x may be formed in a closed circular-shape without the opening 14a. In that configuration, the number of the power-receiving units 34 may be one.

The power-transmission unit 14 and the power-receiving unit 34 may be changed to a configuration in which they are face each other in the radial direction instead of the configuration face each other in the axial direction of the rotating shaft 15.

In the power-transmission unit 14, the resin plate 4 may be provided between the winding support block 22 and the magnetic sheet 3. In this configuration, the winding support block 22 may be thinly formed.

For example, by using a small spacer, the winding support block 22 or the multilayer board 28 may be disposed as form a gap between the magnetic sheet 3 to be floated upwardly from the magnetic sheet 3.

At least either the magnetic sheet 3 or the resin plate 4 may be omitted.

It is possible to also supply an electric power to the power drive device except the detection device 33 thorough the above power-transmission unit 14 and power-reception unit 34.

Also, the storage apparatus 100 can be used to store tools except the reticle, for example, semiconductor integrated circuit wafer.

The invention claimed is:

1. A storage apparatus that stores objects comprising:
   a housing;
   a fixed part disposed in the housing and fixed in a position against the housing;
   a rotating part connected to the fixed part through a rotating shaft extending in the vertical direction and rotates relative to the fixed part as a center of the rotating shaft; and
   a rotating shaft driving part that rotates the rotating shaft;
   wherein
   the fixed part comprises a power-transmission unit that transmits electric power in non-contact state; and
   the rotating part comprising:
   a rotating shelf on which objects are disposed;
   a power drive device that integrally rotates with the rotating shelf and is driven by electric power; and
   a power-receiving unit that supplies the electric power transmitted from the power-transmission unit to the power drive device.

2. The storage apparatus according to claim 1, wherein the power-transmission unit includes,
   a support that surrounds at least a part of the outer circumferential of the rotating shaft, and
   a conductor disposed on the support along a direction in which the support extends,
   wherein the power-receiving unit comprises a coil formed by winding a conductive component, and
   when a magnetic field is generated by flowing a current through the conductor of the power-transmission unit, an induced current is generated in the coil of the power-receiving unit.

3. The storage apparatus according to claim 2, wherein the conductor is provided by a circuit pattern of a printed board.

4. The storage apparatus according to claim 2, wherein the support has a conductor guiding part formed to extend in the circumferential direction, and
   the conductor is disposed along the conductor guiding part.

5. The storage apparatus according to claim 2, wherein the power-transmission unit has a magnetic sheet provided on a side opposite a side where the conductor and the power-receiving unit face each other.

6. The storage apparatus according to claim 5, wherein another component is disposed or a gap is formed between the conductor and the magnetic sheet.

7. The storage apparatus according to claim 6, wherein a plate member made of a non-magnetic material is disposed between the conductor and the magnetic sheet.

8. The storage apparatus according to claim 1, further comprising:
   at least two power-receiving units disposed on a circumference around the rotating shaft, wherein
   the power-transmission unit is disposed to face a rotation track of the power-receiving unit, and
   when viewed in a direction parallel to the rotating shaft, the power-transmission unit is formed in a circle arc shape having an opening along a circumferential direction of the rotating shaft and disposed to always overlap at least one of the power-receiving unit.

9. The storage apparatus according to claim 8, wherein the opening is formed in a size through which the rotating shaft can pass through, and the power-transmission unit is detachably mounted to an outer circumferential side of the rotating shaft.

10. The storage apparatus according to claim 1, wherein the power drive device includes at least one of a temperature sensor, a humidity sensor, a gas component detector and a camera.

* * * * *